United States Patent [19]

Harari

[11] 4,047,974
[45] Sept. 13, 1977

[54] PROCESS FOR FABRICATING NON-VOLATILE FIELD EFFECT SEMICONDUCTOR MEMORY STRUCTURE UTILIZING IMPLANTED IONS TO INDUCE TRAPPING STATES

[75] Inventor: Eliyahou Harari, Irvine, Calif.

[73] Assignee: Hughes Aircraft Company, Culver City, Calif.

[21] Appl. No.: 645,150

[22] Filed: Dec. 30, 1975

[51] Int. Cl.² ............... H01L 21/265; H01L 21/324; H01L 29/78
[52] U.S. Cl. ..................... 148/1.5; 29/571; 29/576 E; 148/187; 148/188; 357/23; 357/54; 357/91
[58] Field of Search .............. 148/1.5, 187, 188; 357/23, 54, 91; 29/571, 576

[56] References Cited

U.S. PATENT DOCUMENTS

| | | | |
|---|---|---|---|
| 3,328,210 | 6/1967 | McCaldin et al. | 148/1.5 |
| 3,500,142 | 3/1970 | Kahng | 357/23 |
| 3,877,054 | 4/1975 | Boulin et al. | 357/23 |
| 3,878,549 | 4/1975 | Yamazaki et al. | 357/23 |
| 3,895,965 | 7/1975 | MacRae et al. | 148/1.5 |
| 3,906,296 | 9/1975 | Maserjian et al. | 357/23 X |
| 3,922,710 | 11/1975 | Koike | 357/54 |
| 3,925,107 | 12/1975 | Goula et al. | 148/1.5 |
| 3,931,632 | 1/1976 | Uchida et al. | 357/23 |
| 3,933,530 | 1/1976 | Mueller et al. | 148/1.5 |
| 3,945,031 | 3/1976 | Kahng et al. | 357/23 |

OTHER PUBLICATIONS

Agusta et al., "Metal-Insulator-Trap-Oxide-Semiconductor Memory Cell," I.B.M. Tech. Discl. Bull., vol. 13, No. 12, May 1971, p. 3636.
Double et al., "FET Gate Integrity by Ion Implantation," Ibid., vol. 16, No. 1, June 1973, p. 8.
Burkhardt et al., "Post-Oxidation Annealing - - - Fixed Charged Levels," Ibid., vol. 18, No. 3, Aug. 1975, p. 753.

*Primary Examiner*—L. Dewayne Rutledge
*Assistant Examiner*—W. G. Saba
*Attorney, Agent, or Firm*—George Tacticos; W. H. MacAllister

[57] ABSTRACT

Disclosed is a non-volatile field effect information storage device which can be electrically written and erased. It consists of an insulated gate field effect transistor having a single gate dielectric material formed in two stages. The gate dielectric is made up of two adjacent layers of silicon dioxide, one of which is relatively thin and adjacent to the semiconductor substrate, while the other is relatively thick and implanted with ions at controlled depths and dosages near the interface with the first silicon dioxide layer. With the application of an appropriate control voltage on the gate structure, charges from the adjacent transistor channel region tunnel through the relatively thin layer of silicon dioxide and become stored in the trapping sites introduced by the implanted ions located in the second layer of silicon dioxide and very near the interface between the two silicon dioxide layers. While there, the charges control the conductivity of the channel, and thus the logic state of the transistor.

5 Claims, 11 Drawing Figures

PROCESS FOR FABRICATING NON-VOLATILE FIELD EFFECT SEMICONDUCTOR MEMORY STRUCTURE UTILIZING IMPLANTED IONS TO INDUCE TRAPPING STATES

FIELD OF THE INVENTION

This invention relates generally to a non-volatile field effect memory device and the process for making same. More specifically it relates to a memory structure consisting of a field effect transistor with a gate dielectric consisting of two layers, one of which is implanted with ions having a distribution peaked in the area closest to the channel of the transistor. These implanted ions are used as trapping centers for the charges that are tunneled through the thin dielectric layer that separates them from the channel region of the transistor.

BACKGROUND

A non-volatile memory is a device that can retain stored information without an external power source. One way of accomplishing this is by using a field effect transistor where the controlling electric field is generated by charges trapped in the gate structure of the device. Such charge trapping sites may be formed in the gate insulator material in a variety of ways. For example, one such trap formation is accomplished by using a dual dielectric layer for the gate insulator and using the normally occurring interfacial states as traps for charges. With the application of an appropriate control voltage on the gate structure, charges from the transistor channel region tunnel through the normally thin first dielectric material and are trapped in the interfacial states. The second dielectric is made thick enough to prevent any further tunneling of the charges through it. The charges cannot tunnel back to their original position since they need the influence of an electric field of opposite polarity to the one that caused them to tunnel through the first dielectric initially. In the absence of any external field, the charges will remain trapped in their positions. This phenomenon provides the non-volatile character of the structure. While the charges remain stored in these interfacial states they provide an electric field of their own which influences the conductivity of the transistor channel. Because of the proximity of the charges to the channel, the field generated by these charges is sufficient to control the logic state of the device. Assuming a proper biasing for the drain and source regions of the transistor, the device cannot change its logic state unless and until a control voltage of opposite polarity forces the charges back into the channel and thus eliminates their control over the conductivity of the channel.

Among the most important parameters for such devices are the write and erase times, the control voltage, and the threshold voltage of the transistor. The write and erase times must be as small as possible for optimum high frequency operation. Fast writing can be accomplished by decreasing the thickness of the dielectric that the charges have to tunnel through thus increasing the tunnel current, or by increasing the density of available traps, or by introducing traps of high efficiency for capturing the tunneled charges i.e. traps with a large capture cross section. However, the dielectric must be thick enough to prevent the charges from tunneling back in the absence of any control voltage. The thickness of this dielectric is also determinative of the size of the control voltage that is required to cause a tunneling of the charges. The threshold voltage depends on the density and polarity of the stored charges and how close they are to the semiconductor interface. It is clear therefore that accurate control of the thickness of the thin dielectric layer contiguous to the silicon surface, together with accurate control of the density of charge trapping states, are the two key ingredients for a successful fabrication of non-volatile memories with reproducible electrical characteristics.

PRIOR ART

A well-known prior art device uses the naturally occurring interface states created by the lattice mismatch between two dissimilar dielectric layers to trap and store charges. Such a structure is usually referred to as a dual dielectric charge storage memory cell (DDC). One of the better known DDC structures is the one referred to as an MNOS device (metal-silicon nitride-silicon dioxide-silicon). Another is the MAOS (metal-aluminum oxide-silicon dioxide-silicon) device. The MNOS cell consists of a field effect transistor formed on a surface of a silicon substrate with the first of the two gate dielectrics made out of silicon dioxide and the other out of silicon nitride ($Si_3N_4$). On the top of the silicon nitride layer is the gate metal (usually aluminum). A diagrammatic cross-sectional view of such a structure is shown in FIG. 1, which is described in some detail at a later section of the specification. Furthermore, more discussion of MNOS devices is contained in a publication by Andrew C. Tickle and Frank M. Wanlass, entitled "Electrically Alterable Nonvolatile Semiconductor Memories," Session 4, 1972 Wescon Technical Papers.

During the writing operation charges are tunneled through the $SiO_2$ layer and are trapped at the silicon dioxide-silicon nitride interface. The silicon dioxide layer is very thin, in the range of 20–60 A. for fast write/erase operations, and the control voltage in the range between 25 and 50 volts. The density of the interface states created by the lattice mismatch of the two dielectrics is in the order of $10^{12}/cm^2$. Because of the small amounts of trapping sites, only a few of the charges will be captured at the interface centers. To capture more of these, there must be an increased current density which requires a greater write/erase voltage and a thinner $SiO_2$ layer. However, large control voltage swings restrict the usefulness of these devices in many applications and cause eventual degradation, or wearout of the devices, thus reducing their ability to store charges. Similarly, a very thin and uniform $SiO_2$ layer is difficult to make without having pin holes and other defects in it.

Another prior art memory cell, which seeks to overcome the problems with MNOS or MAOS structures, is the one described in an article by D. Kahng et al., entitled "Interfacial Dopants for Dual-Dielectric, Charge-Storage Cells," published in the Bell Systems Technical Journal, Vol. 53, No. 9, November 1974, at page 1723. This is basically an MAOS structure with an additional interfacial monolayer of dopant such as W (tungsten) deposited between the two oxides in a concentration of $10^{14}$ to $10^{15}$ atoms/$cm^2$ to increase the number of available trapping centers. Such a structure is shown in FIG. 2 and is described further at a later section of the specification. These devices require a writing current of smaller density and therefore allows the construction of devices which on the average have thicker $SiO_2$ layer (in the range of 50–150 A. as opposed to 20–60 A. for the MNOS cells) for the same write/erase voltage.

However, the deposition of an interfacial dopant is a difficult operation which does not readily lend itself to large scale production and a thicker $SiO_2$ layer slows down the write/erase speed of the device.

THE INVENTION

The general purpose of this invention is to provide a new and improved non-volatile field effect memory structure and the fabrication process therefor, having most if not all of the advantages and features of similarly employed devices and related processes, while eliminating many of the aforementioned disadvantages of prior art structures. To accomplish this purpose, I have provided a device and fabrication process therefor wherein active field effect transistor regions, including a source region, a gate region and a drain region, are formed on a silicon semi-insulating structure. A first layer of relatively thick silicon dioxide is formed on the top of the gate region and this layer is implanted with ions near the silicon interface so that they can be used as charge trapping sites for non-volatile memory operation. Then a second layer of silicon dioxide is thermally grown under the previous silicon dioxide layer.

The implanted ions in the vicinity of the interface between the two layers of silicon dioxide will provide enough trapping centers for any charges that are caused to tunnel from the channel of the transistor through the adjacent oxide layer. The thickness of the $SiO_2$ layer next to the channel is very easily controlled, since the oxidation process is slowed down by the first $SiO_2$ layer grown prior to the implantation. The implanted ions on the thicker $SiO_2$ layer have a distribution sharply peaked towards the interface between the two oxide layers. This is accomplished by taking advantage of the property that certain ion species, such as $Al+$, have to diffuse rapidly at elevated temperatures in silicon but only slightly in thermal silicon dioxide. By regulating the depth and dosage of the implanted ions so that they are mostly accumulated in the $SiO_2$-Si interface (in the vicinity of the gate region), and by diffusing into the Si substrate through annealing the ions on the Si side, and by then growing a new and very thin layer of thermal $SiO_2$, a portion of a cell is achieved where a sufficient amount of trapping centers is formed at a very small and easy-to-control distance from the transistor channel and separated from it by a high quality and uniform in thickness layer of $SiO_2$.

Through this approach both N-channel and P-channel memory cells can be constructed with good retention properties, high write/erase speeds and low control voltage. Most discussion focuses around the N-channel cells because the mobility of the electrons is higher than that of the holes and this makes the operation of the cells in a memory array faster. However, the same principles apply to the fabrication of both P and N type memory cells.

Accordingly, it is an object of the present invention to provide a new non-volatile field effect memory cell in silicon substrates.

Another object of this invention is to provide a non-volatile field effect memory cell having higher write and higher erase speeds, higher retention time, and requiring a lower control voltage.

A more specific object is to provide a non-volatile field effect memory cell with a single gate dielectric formed in two stages, and trapping sites generated by the implantation of ions in the gate dielectric.

Another object of this invention is to provide a highly reproducible and simple process for the fabrication of non-volatile field effect memory structures having a very thin and uniform $SiO_2$ layer to separate the stored charges from the transistor channel.

Still a further object of this invention is to provide a non-volatile field effect memory with a single gate dielectric formed in two stages which can permanently trap either electrons or holes.

Yet another object of this invention is to provide a method for controlled threshold voltage shifting in any desired region of an integrated circuit device.

These and other objects of the invention will become more readily apparent in the following description taken in conjunction with the accompanying drawings.

DRAWINGS

DETAILED DESCRIPTION

Figure 1:
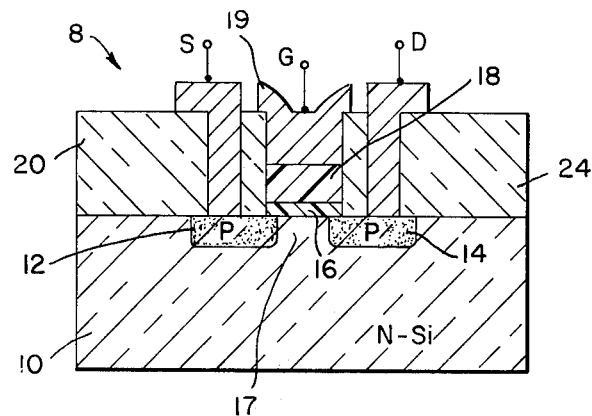
FIG. 1 illustrates a diagrammatic cross-sectional view of a prior art non-volatile field effect memory cell.

Referring now to FIG. 1, there is shown one prior art P-channel field effect memory cell generally designated 8. The structure includes an N-type silicon substrate 10, and two P-type regions 12 and 14 for the source and drain regions, respectively. It also includes a gate structure comprising a thin layer of $SiO_2$ 16 adjacent to a conducting channel 17 between the source and drain regions, a layer of silicon nitride 18 on the top of the $SiO_2$ layer, and a gate metal 19 on the top of the silicon nitride layer. The $SiO_2$ gate layer has a thickness ranging between 20 and 60 angstroms. The silicon nitride layer is much thicker, normally in the range between 300 to 1000 angstroms. The source and drain regions are covered by thick field oxide layers 20 and 24, respectively, with openings for ohmic contact means. The charges are stored in traps at or near the silicon dioxide/silicon nitride interface. This cell is often referred to as an MNOS structure. Some of the limitations of such a structure have been mentioned in the description of the prior art. These limitations are basically due to the limited number of trapping sites available and to the difficulty in reproducibly processing a good quality $SiO_2$ layer of uniform thickness and without pinholes. A further limitation of the MNOS is that charge can be permanently trapped in the bulk of the nitride layer without the possibility for erasure, and this reduces the effective margin between the two logic levels of the memory device.

Figure 2:
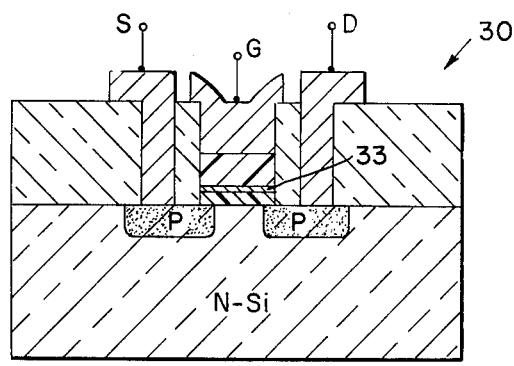
FIG. 2 illustrates a diagrammatic cross-sectional view of another prior art non-volatile field effect memory cell.

Referring now to FIG. 2, there is shown another prior art field effect memory cell 30. It has basically the same configuration as that described in FIG. 1, with the addition of a new monolayer of tungsten 33 between the two oxide layers of the gate assembly. The purpose of this layer is to increase the number of trapping centers in the interface between the two oxide dielectrics. In addition, in this structure the $SiO_2$ layer adjacent to the channel is thicker, usually in the range between 50 and 150 angstroms. This structure is very difficult to construct reproducibly because of the difficulties in the deposition of the dopant monolayer. The total number of dopant atoms is critical for the quality of the second insulating layer deposited on the dopant monolayer.

Figure 3A:
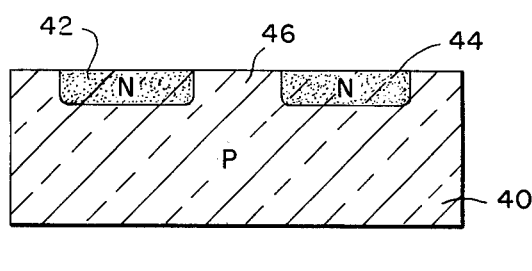
FIGS. 3a through 3i illustrate, in a series of diagrammatic cross-sectional views and implanted ion profiles, a sequence of some of the most important process steps utilized in fabricating a non-volatile field effect memory cell in accordance with the present invention.

Referring now to FIG. 3, there is shown in FIG. 3a a P-type substrate on which two N-type regions 42 and 44 have been formed for source and drain regions, respectively. The two N-type regions are separated by a P-type channel region 46. Thus, FIG. 3a shows a conventional active portion of a field effect structure.

Figure 3B:
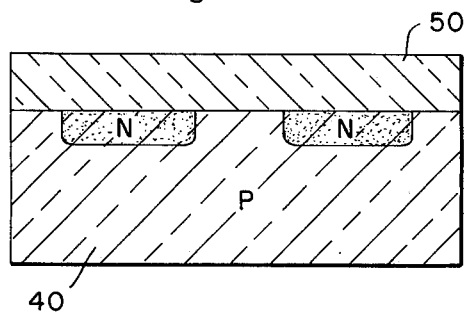
Figure 3C:
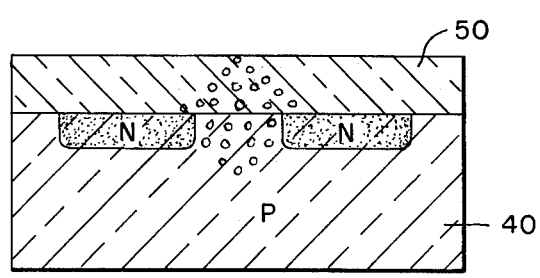
Figure 3D:
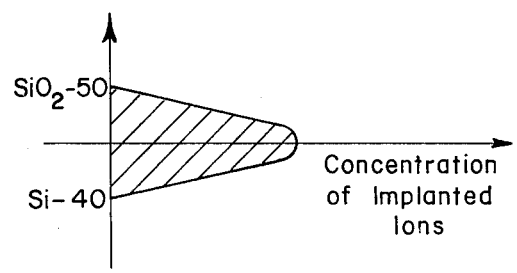
Figure 3E:
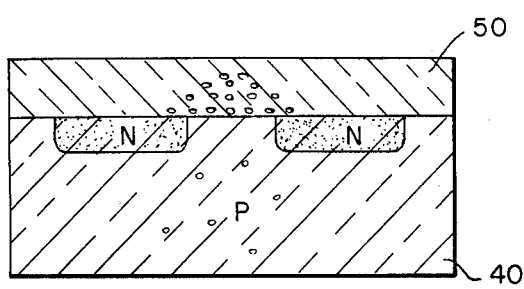
Figure 3F:
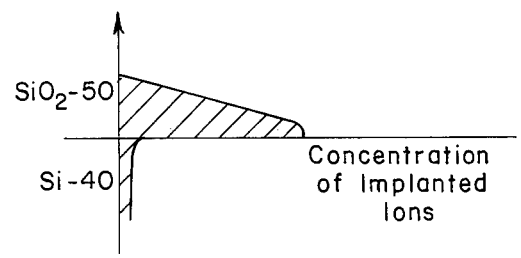
Figure 3G:
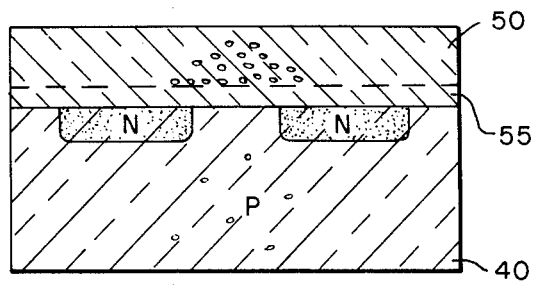
Figure 3H:
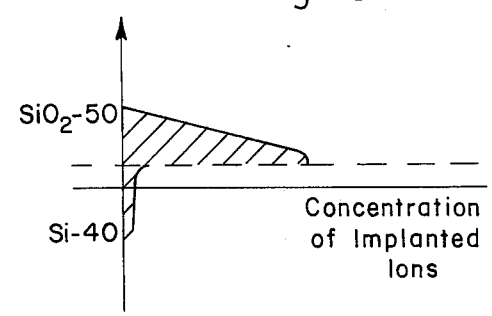

FIG. 3b shows a layer of SiO₂ over the surface of the transistor. This is thermally grown and has a thickness ranging between 300 Å and 1,000 Å. The SiO₂ layer is then implanted with ions at a controlled depth and dosage using conventional ion implantation techniques, so that their concentration is peaked in the SiO₂-Si interface over the channel region. FIG. 3c shows the location of the implanted ions and FIG. 3d shows a distribution profile of the implanted ions. Aluminum ions were used for the construction of a test unit. However, many other types of ions such as, for example, tungsten, titanium, gold, molybdenum and chromium may also be used for this purpose. Subsequent to the implantation, the structure is annealed at a temperature between 700° C and 1,000° C for 10 to 30 minutes to cause the aluminum ions that have reached into the channel region to diffuse away from the channel and into the substrate. FIG. 3e shows a diagrammatic view of the structure after annealing and FIG. 3f shows the new profile of the implanted ions. Because of the finite number of ions in the tail extending into the silicon, this diffusion does not significantly affect the electrical characteristics of the device. During the anneal process, the ions implanted into the SiO₂ layer will move only slightly, while essentially maintaining their initial position close to the channel but on the oxide side of the interface. Then the structure goes through a new oxidation. This is a slow process because the new layer is grown under the other SiO₂ layer previously formed, which considerably slows down the rate of arrival of oxygen atoms at the silicon surface. Therefore, the thickness of the new layer is easy to control. Furthermore, since this is one of the last operations, its high quality remains unaltered. FIG. 3g shows the structure after the formation of the second gate oxide layer and FIG. 3h shows the resulting ion profile. The second oxidation can be further slowed down for optimum control by lowering the oxidation temperature, which also has the additional beneficial effect of lessening the movement of the implanted ions in the first oxide layer. The thickness of the new oxide layer can be chosen according to the required application. For example, in applications where very long retention times are important this layer will be made relatively thick, typically 100 Å., while for applications where fast write and erase times are important while retention is of only secondary importance, the thickness will be 20 Å. or less. In fact, the device will operate as short-retention memory even when the thin oxide layer is altogether omitted. The ease with which the thickness of the thin oxide layer can be controlled down to 5 or 10 Å. thickness is a distinct advantage of the process in this invention.

Figure 3I:
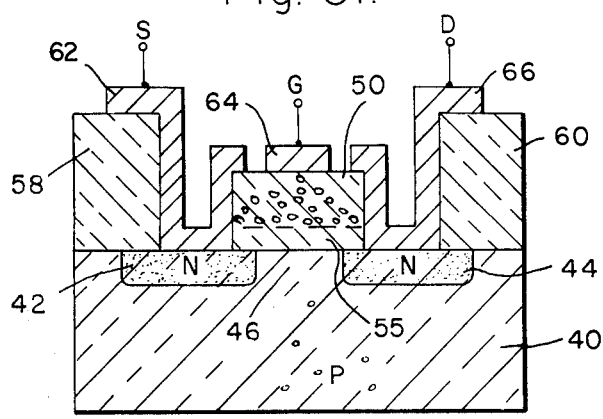

FIG. 3i gives a diagrammatic cross-sectional view of the device after the formation, through conventional processes, of metal contacts on the source, gate and drain regions of the device. The structure includes a substrate 40, a source region 42, a drain region 44, a channel region 46, a silicon dioxide layer 55 adjacent to the channel region, a silicon dioxide layer 50 adjacent to layer 55 and implanted with ions, field oxide regions 58 and 60 which extend throughout the field region and insulate adjacent devices, a gate metal 64, and source and drain electrodes 62 and 66, respectively.

With the application of a writing pulse in the range of 25 to 45 volts on the gate electrode, electrons are caused to tunnel from the adjacent transistor channel region and through the adjacent thin SiO₂ layer to the thicker SiO₂ layer where they get trapped into states created by the implanted ions. While there, they cause an inversion of the channel from P-type to N-type and with a proper biasing on the source and drain regions (i.e. source grounded and drain at +10 volts) current will flow through the channel. The transistor of this memory cell will thus be "on" and stay "on" regardless of the existence or absence of the writing voltage pulse at the gate electrode. This occurs because the inversion of the channel is not caused by the writing voltage at the gate electrode but by the charges that the application of this voltage transferred and stored into traps inside the gate dielectric.

This characteristic gives the device its nonvolatile character. To turn the transistor "off" (or erase the information stored on the memory cell) a voltage pulse of approximately equal value and opposite polarity from that of the writing pulse will have to be applied to the gate electrode which will cause the stored charges to tunnel back to the channel region and will leave no electric field in the gate dielectric to maintain the channel inverted. Therefore, the channel will once again have a P-type conduction and will cut-off the source-to-drain current.

Writing can also be achieved through an avalanche breakdown of the drain junction accompanied by a control voltage on the gate. This voltage attracts into the dielectric highly energetic charges created in the avalanche region. Under this scheme although charge trapping occurs only in the dielectric close to the drain region, this is sufficient to control the conduction state of the entire MOSFET channel. This is particularly the case for very short channel devices where source to drain spacing is approximately 1 μm.

While the invention has been described in connection with a preferred sequence of process steps to fabricate a basic field effect memory structure, it will be understood that it is not intended to limit the invention to those process steps, their sequence, or the final structure depicted in the drawings. On the contrary, it is intended to cover all alternatives, modifications and equivalents, as may be included within the spirit and scope of the invention as defined by the appended claims.

What is claimed is:

1. A process for fabricating a non-volatile field effect memory cell comprising the steps of:
    a. forming active field effect transistor regions, including a source region, a gate region, and a drain region, on a silicon semi-insulating substrate;
    b. forming a first layer of silicon dioxide on top of said gate region;
    c. implanting ions into said silicon dioxide layer near the silicon interface whereby said implanted ions provide charge trapping sites for non-volatile memory operation;
    d. annealing said structure in a nonoxidizing ambient at a predetermined elevated temperature sufficient to diffuse any of said ions that have reached into said substrate but not affecting significantly the distribution of ions implanted into said first silicon dioxide layer;

e. thermally growing a second layer of silicon dioxide under said first layer of silicon dioxide.

2. A process as set forth in claim 1 wherein:
   a. said implanted ions belong to a species selected from a group consisting of aluminum, tungsten, titanium, gold, molybdenum and chromium;
   b. said second layer of silicon dioxide is formed to a thickness ranging between 5 and 100 angstroms.

3. A process for fabricating a non-volatile field effect memory device comprising the steps of:
   a. forming a source region, a gate region and a drain region on a surface of a semi-insulating silicon substrate;
   b. forming a first layer of silicon dioxide on top of said surface;
   c. implanting ions belonging to a species selected from a group consisting of aluminum, tungsten, titanium, gold, molybdenum and chromium into a section of said first silicon dioxide layer lying over the gate region at controlled depths and dosages whereby the distribution of said ions peaks close to the silicon and silicon dioxide interface;
   d. annealing said structure at a predetermined elevated temperature sufficient to disperse through diffusion any ions that may have reached said substrate while not significantly affecting the distribution of said ions implanted into said silicon dioxide whereby obtaining a structure where said implanted ions are concentrated in said gate silicon dioxide in close proximity to said silicon interface;
   e. forming through thermal oxidation a second and relatively thin layer of silicon dioxide under said first layer of silicon dioxide;
   f. forming ohmic contact means on said source region, on said drain region and on said implanted silicon dioxide layer on top of said gate region.

4. In an improved process of fabricating a field effect memory cell comprising the steps of forming source, gate and drain regions on a semi-insulating silicon substrate and forming a first layer of silicon dioxide for a gate insulation the improvement which comprises the steps of:
   a. implanting a predetermined type of ions into a section of said first silicon dioxide layer near the silicon interface whereby said implanted ions provide charge trapping sites for non-volatile memory operation;
   b. annealing said substrate in a nonoxidizing ambient at a predetermined elevated temperature to thin out through diffusion any of said implanted ions that reached into said substrate;
   c. thermally growing a second layer of silicon dioxide under the first silicon dioxide layer whereby said trapping sites are separated from said substrate by a relatively pure layer of silicon dioxide having a predetermined thickness.

5. A process as set forth in claim 4 wherein:
   a. said implanted ions belong to a species selected from a group consisting of aluminum, tungsten, titanium, gold, molybdenum and chromium; and
   b. said second layer of silicon dioxide is formed to a thickness ranging between 5 and 100 angstroms.

* * * * *